United States Patent [19]
Hoshi

[11] Patent Number: 5,150,329
[45] Date of Patent: Sep. 22, 1992

[54] DYNAMIC MEMORY WITH A REFRESH CONTROL CIRCUIT

[75] Inventor: Katsuji Hoshi, Tokyo, Japan

[73] Assignee: NEC Corporation, Tokyo, Japan

[21] Appl. No.: 555,697

[22] Filed: Jul. 23, 1990

[30] Foreign Application Priority Data
Jul. 21, 1989 [JP] Japan .................................. 1-189440

[51] Int. Cl.⁵ ........................ G11C 11/00; G11C 13/00
[52] U.S. Cl. .................................. 365/222; 365/189.01
[58] Field of Search ............................ 365/222, 189.01

[56] References Cited
U.S. PATENT DOCUMENTS
3,737,879  6/1973  Greene et al. ...................... 365/222

Primary Examiner—Terrell W. Fears
Attorney, Agent, or Firm—Sughrue, Mion, Zinn, Macpeak & Seas

[57] ABSTRACT

The dynamic memory of the present invention allows refresh operations with low power consumption and with easy control. The dynamic memory includes a detection circuit which detects a decrease in the power voltage source and a control circuit to automatically refresh a memory cell in response to the detected signal.

2 Claims, 6 Drawing Sheets

DYNAMIC MEMORY WITH A REFRESH CONTROL CIRCUIT

BACKGROUND OF THE INVENTION

The present invention relates to a dynamic memory, and more particularly to a dynamic random access memory having a built-in refresh address counter.

Dynamic random access memories (DRAM) are extensively used as a high speed, large capacity memory. The mainstream of DRAMs currently in use is of an address multiplex type. The address multiplex type DRAM is structured so that row address signals are taken in as an active level of a row address strobe signal ($\overline{RAS}$) via a pair of address input terminals, and then column address signals are taken in as an active level of a column address strobe signal ($\overline{CAS}$) via the same pair of address input terminals. This construction reduces the number of address terminals to one half and also reduces the size of package.

As one method of refreshing an address multiplex type DRAM is known where, contrary to the use of the row address strobe signal at the time of normal accessing as an active level and then using the column address strobe signal as an active level, the column address strobe signal is used first as an active level and then the row address strobe signal is used as an active level to refresh the memory cell of the row designated by the built-in refresh address counter as the internal refresh mode of the DRAM. This technique has been called as $\overline{CAS}$ Before $\overline{RAS}$ (CBR) refreshing and is now employed in large capacity DRAMs. In order to refresh all of the memory cells, a CBR refreshing operation must be repeated for all of the rows of a memory array.

With the prior art DRAM as mentioned above, the refreshing operation is carried out using a power source at a voltage level similar to that used during the normal accessing operation. This arrangement consumes a relatively large amount of power during the refreshing operation.

Also CBR refreshing requires a controlling operation by an external a unit to successively activate a column address strobe signal and then a row address strobe signal each time DRAM is in the CBR refreshing cycle. This complicates the control of the refreshing operation and thus lowers the operating efficiency.

SUMMARY OF THE INVENTION

An object of the present invention is to provide a dynamic semiconductor memory with reduced power consumption at the time of a refreshing operation.

Another object of the present invention is to provide a dynamic semiconductor memory which is capable of a simple refreshing operation without requiring an additional external control unit.

The dynamic semiconductor memory according to this invention comprises a memory array having a plurality of memory cells arranged in rows and columns, an address input device to input row address information from an external unit, and a refresh address counter to output an internal refresh address. A selecting device is connected to both the address input device and the refresh address counter to output as output information row address information when in a first state and an internal refresh address when in a second state. A refresh device is provided to select one of the rows in the memory array based on the output information taken out from the selecting device to refresh the memory cell of the row thus selected. A control device controls the selecting device in the first state when a voltage of the power voltage source is at a first level and in the second state when the voltage is at a second level that is smaller than the first level.

According to the present invention, the internal address information of the refresh address counter is supplied to the refresh means by a simple operation of lowering the supply voltage from the first level to the second level, thereby performing automatic refreshing inside the memory.

DETAILED DESCRIPTION OF THE INVENTION

Description of the Prior Art

Figure 1:
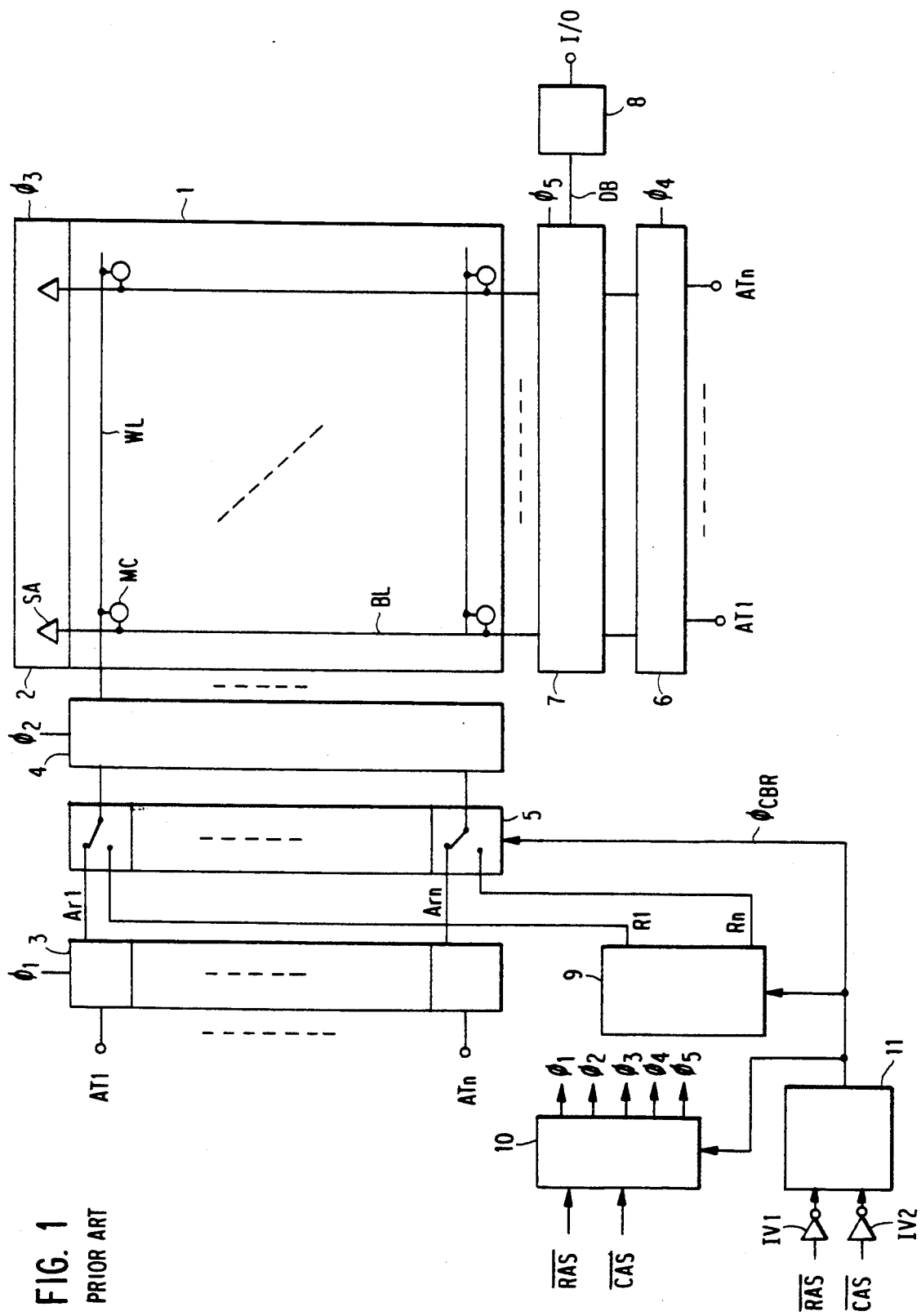
FIG. 1 is a block diagram to show the construction of a prior art dynamic memory.
Figure 2:
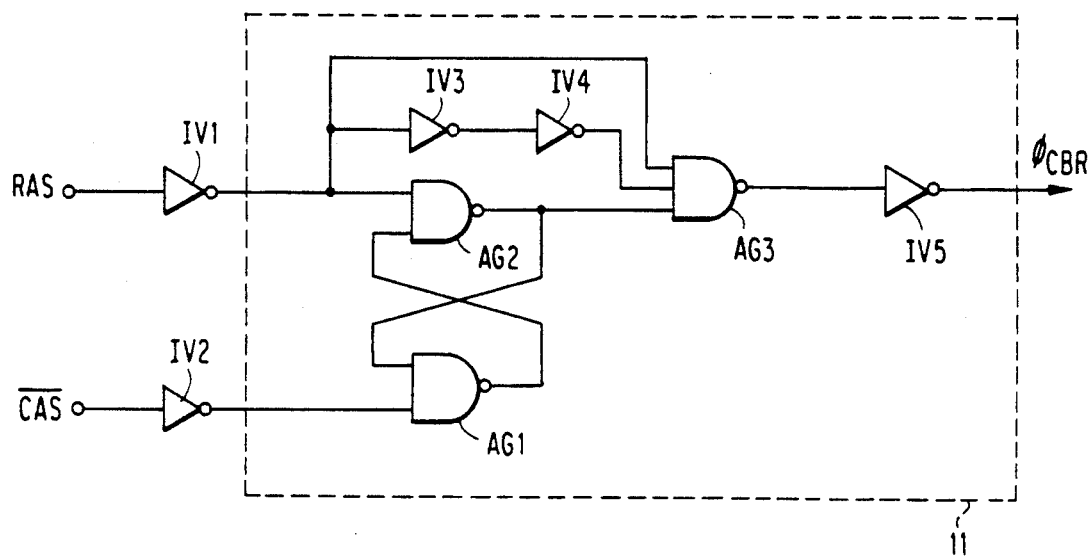
FIG. 2 is a block diagram of a refresh mode detection circuit.

Referring to FIGS. 1 through 3, the dynamic memory of the prior art will now be explained.

FIG. 1 shows the overall construction of the dynamic memory. The memory cell array 1 includes plural dynamic memory cells MC arranged in rows and columns, word lines WL arranged in each row and bit lines BL arranged in each column. A sense amplifier block 2 has plural refresh sense amplifiers SA which are provided in each column. A row address buffer 3 latches information at address terminals $AT_1$-$AT_n$ as row address information in response to a timing signal $\phi_1$. An address switch circuit 5 is inputted with row address signals $Ar_1$-$Ar_n$ from the row address buffer 3 and with count signals $R_1$-$R_n$ from the refresh address counter, supplies row address signals $Ar_1$-$Ar_n$ to a row address decoder 4 when an internal refresh mode signal $\phi_{CBR}$ is at an inactive level and supplies count outputs $R_1$-$R_n$ to the row address decoder 4 when the signal $\phi_{CBR}$ is at an active level. The row address decoder 4 selects one word line which is designated by the signals $Ar_1$-$Ar_n$ or $R_1$-$R_n$ in response to a timing signal $\phi_2$. Information stored in the memory cell MC which is connected with the word line WL thus selected is read out in parallel at bit lines BL and also amplified and refreshed by the sense amplifier 2 which is energized in response to a timing signal $\phi_3$. A column address buffer 6 latches information of address terminals $AT_1$-$AT_n$ as column address information in response to a timing signal $\phi_4$. A column address decoder 7 establishes a signal path between one of the bit lines BL and a bus line DB in response to a timing signal $\phi_5$. The bus line DB is connected to input/output terminals via an input/output circuit 8. A timing signal generator 10 receives a row address strobe signal RAS, a column address strobe signal $\overline{CAS}$, and a signal $\phi_{CBR}$, and generates timing signals $\phi_1$, $\phi_2$ and $\phi_3$ in this order upon activation of the signal RAS when the signal $\phi_{CBR}$ is at an inactive level. By realizing an active level for $\overline{CAS}$ after $\overline{RAS}$ reaches an active level, the timing signal generator 10 also generates signals $\phi_4$ and $\phi_5$ in this order. These steps are routinely conducted during an access operation.

Figure 3A:
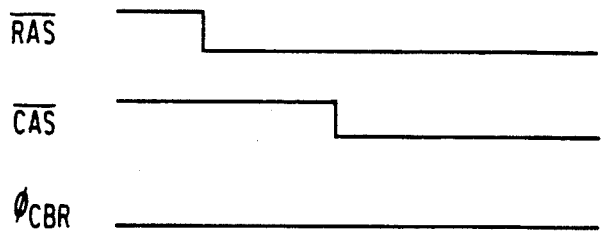
FIGS. 3A and 3B show the waveforms to explain the operation of CBR generation circuit.
Figure 3B:
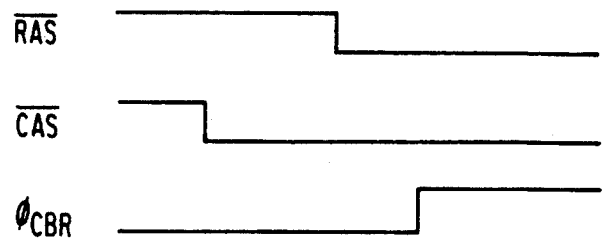

An example of a detection circuit 11 is shown in FIG. 2. NAND gates AG$_1$, AG$_2$ constitute a flip-flop and inverters IV$_3$, IV$_4$ a delay circuit. As shown in FIG. 3A, the circuit 11 outputs an inactive signal $\phi_{CBR}$ when the signal $\overline{RAS}$ is at an active (low) level and when the signal $\overline{CAS}$ reaches an active level or during a normal access cycle. In the meantime, as shown in FIG. 3B, when the signal $\overline{RAS}$ is activated after the signal $\overline{CAS}$ is brought to an active (low) level, the signal $\phi_{CBR}$ at an active level is outputted after a delay time of the inverters IV$_3$, IV$_4$ elapsed following said activation of the signal $\overline{RAS}$.

CBR refreshing operation will now be explained. The signal $\overline{CAS}$ is first brought to an active (low) level, and then the signal $\overline{RAS}$ is detected to be at an active (low) level. The refresh mode detection circuit 11 then outputs a signal $\phi_{CBR}$, which is supplied to the timing signal generator 10 to successively activate the signals $\phi_2$ and $\phi_3$. Signals $\phi_1$, $\phi_4$ and $\phi_5$ remain inactive during this time. Because of the active (high) level of the signal $\phi_{CBR}$, the count outputs R$_1$-R$_n$ of the refresh address counter 9 are supplied to the row address decoder 4 via the address switch circuit 4 to select one of the word lines depending on the content of the counter 9 and to refresh the memory cell which is connected to the word line thus selected. The signal $\phi_{CBR}$ subsequently returns to an inactive level, and the internal refreshing operation is completed.

By conducting the CBR refreshing operation for all of the word lines in the array 1, all the memory cells are refreshed. In other words, as the steps of activating the signal $\overline{CAS}$ and of subsequently activating the signal $\overline{RAS}$ are repeated for the number of times corresponding to the total number of the word lines WL in the memory array, the entire memory cells in the array are refreshed.

The above procedure involves complex operation of the signals $\overline{RAS}$ and $\overline{CAS}$ and requires a complicated external system.

It is also noted that during the internal (CBR) refreshing operation, the source voltage is maintained at the level routinely employed for the normal access operation and the power consumption during the internal refreshing operation is considerable.

An embodiment of the present invention will now be explained referring to FIG. 4.

Figure 4:
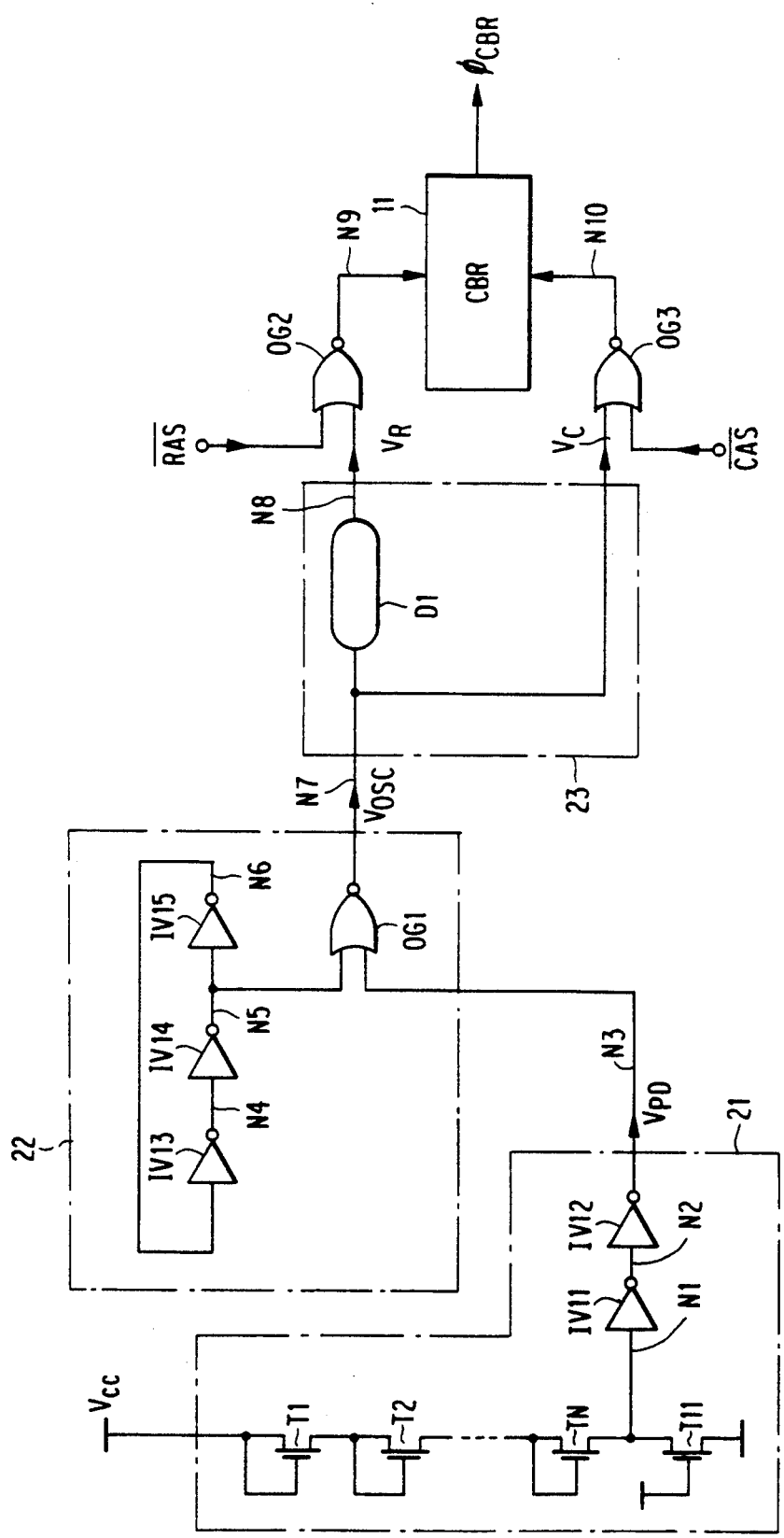
FIG. 4 is a block diagram to show a refresh control circuit of the first embodiment according to the present invention.

The memory of the first preferred embodiment is realized by replacing the inverters IV$_1$, IV$_2$ and the detection circuit 11 shown in FIG. 1 with a refresh control circuit of FIG. 4. The rest of the structure is identical to that shown in FIG. 1. The following description will therefore refer only to the control circuit.

In the first preferred embodiment, a source voltage detection circuit 21 is provided with MOS transistors of an N-channel enhancement type, T$_1$-T$_N$, T$_{11}$ and inverters IV$_{11}$, IV$_{12}$, and outputs a signal V$_{pd}$ for detecting the source at a low level when the source voltage Vcc drops below the lower limit of the recommended operating voltage (hereinafter referred to as rated voltage). An oscillation circuit 22 is provided with inverters IV$_{13}$, IV$_{14}$, IV$_{15}$ and a NOR gate OG$_1$, and outputs an oscillation signal V$_{OSC}$ of a predetermined frequency when the source voltage detection signal V$_{pd}$ is at a high level. A CBR signal generator circuit 23 is provided with a delay element D1, and is inputted with the oscillation signal V$_{OSC}$ to generate first trigger signal V$_C$ without delay as well as the second trigger signal V$_R$ with a delay of a prescribed time from the first trigger signal V$_C$. The second trigger signal V$_R$ is inputted at a NOR gate OG$_2$ together with a row address strobe signal $\overline{RAS}$, while the first trigger signal V$_C$ is inputted at a NOR gate OG$_3$ together with a column address strobe signal $\overline{CAS}$. Outputs from the NOR gates OG$_2$ and OG$_3$ are inputted at the detection circuit 11 which outputs a signal $\phi_{CBR}$. The structure of the detection circuit 11 is shown in FIG. 2.

The operations of the embodiment will now be explained. The MOS transistors T$_1$-T$_N$ of the voltage detection circuit 21 with the input of source voltage Vcc are in diode connection, the number of stages is so selected that when the source voltage Vcc is within the rated operating voltage range (e.g. 5.5-3.5 V), an output node N2 of the Inverter IV$_{11}$ with the input of an output node N1 comes to a low level and when the voltage Vcc is lower than the lower limit of the recommended operating voltage, the output node N2 of the inverter IV$_{11}$ comes to a high level.

The voltage level when the source voltage Vcc is within the rated operating voltage or the level of the source voltage, detection signal V$_{pd}$ is high which is an inactive level, and the level at a node N7 which is the output (V$_{OSC}$) of the NOR gate OG$_1$ having the voltage detection signal V$_{pd}$ as the gate input becomes low. Since the level at the nodes N9 and N10 varies in synchronization with the row address strobe signal $\overline{RAS}$ and the column address strobe signal $\overline{CAS}$ that are inputted from the outside, the normal access operation becomes possible.

When the source voltage Vcc drops below the lower limit of the recommended operating voltage, the source voltage detection signal V$_{pd}$ reaches a low or active level, and an oscillation signal V$_{OSC}$ of the output node N5 of the ring oscillator comprising the inverters IV$_{12}$-IV$_{15}$ is outputted at the output node N7 of the NOR gate OG$_1$. At the node N8, the second trigger signal V$_R$ in the same phase but slightly delayed from the oscillation signal V$_{OSC}$ by the delay element D1 is outputted. And the detection circuit 11 is held in a state identical to the state when the gate input of the NOR gates OG$_2$ and OG$_3$ is in the CBR refresh cycle, or when the row address strobe signal $\overline{RAS}$ is activated after the row address strobe signal $\overline{RAS}$ is activated. In other words, the detection circuit 11 is inputted via the gate circuits OG$_2$ and OG$_3$ with signals that are identical to the row address strobe signal $\overline{RAS}$ and the column address strobe signal $\overline{CAS}$ during the $\overline{CBR}$ refresh cycle. The detection circuit 11 judges the level and the timing of these signals and outputs the refresh control signal $\phi_{CBR}$ to effect CBR refresh operation.

Figure 5:
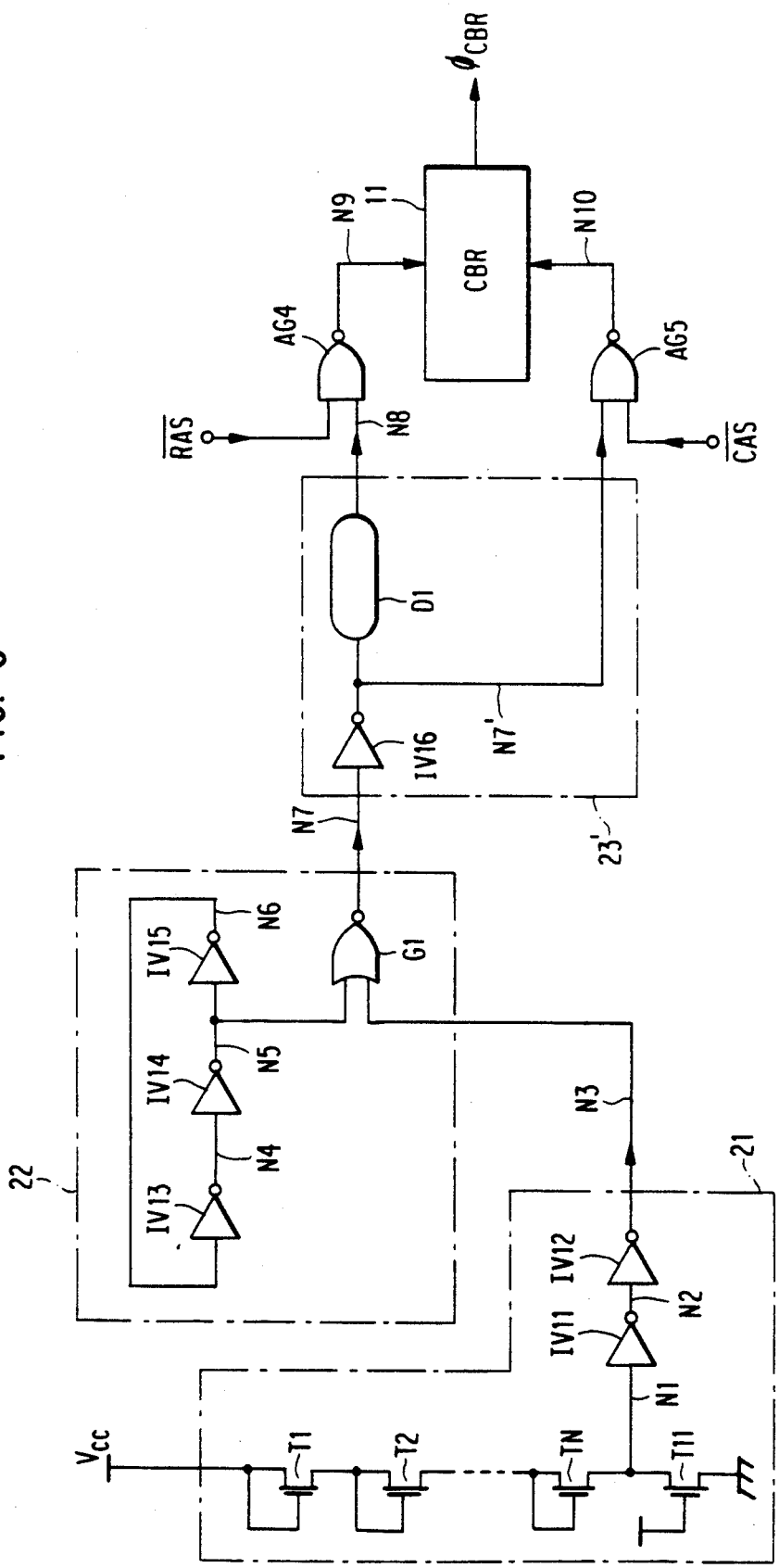
FIG. 5 is a block diagram to show a refresh control circuit of the second embodiment according to the present invention.

A refresh control circuit according to the second preferred embodiment is shown in FIG. 5. According to the second preferred embodiment, the CBR signal generator 23' comprises an inverter IV$_{16}$ and a delay element D1 and the gate circuits OG$_2$ and OG$_3$ are replaced by NAND gates AG$_4$ and AG$_5$ respectively. The operation is substantially the same as that in the first embodiment.

Figure 6:
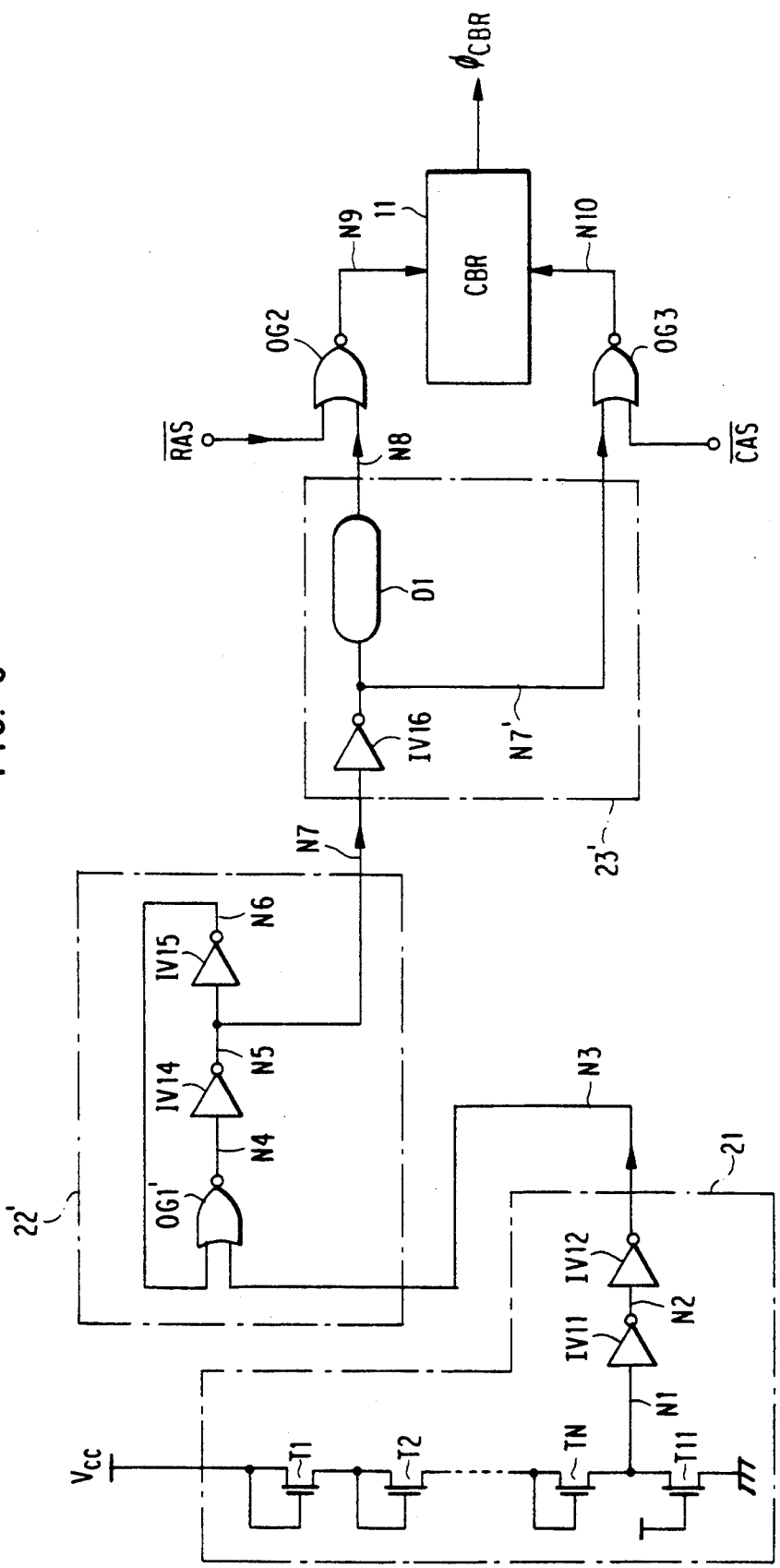
FIG. 6 is a block diagram to show a refresh control circuit of the third embodiment according to the present invention.

A refresh control circuit according to the third preferred embodiment is shown in FIG. 6. According to this embodiment, the ring oscillation circuit 22' comprises a NOR gate OG1' and inverters $IV_{14}$ and $IV_{15}$, the NOR gate OG1' being incorporated in the loop of the ring oscillator. The CBR signal generator 23' comprises an inverter $IV_{16}$ and a delay element D1.

Figure 7:
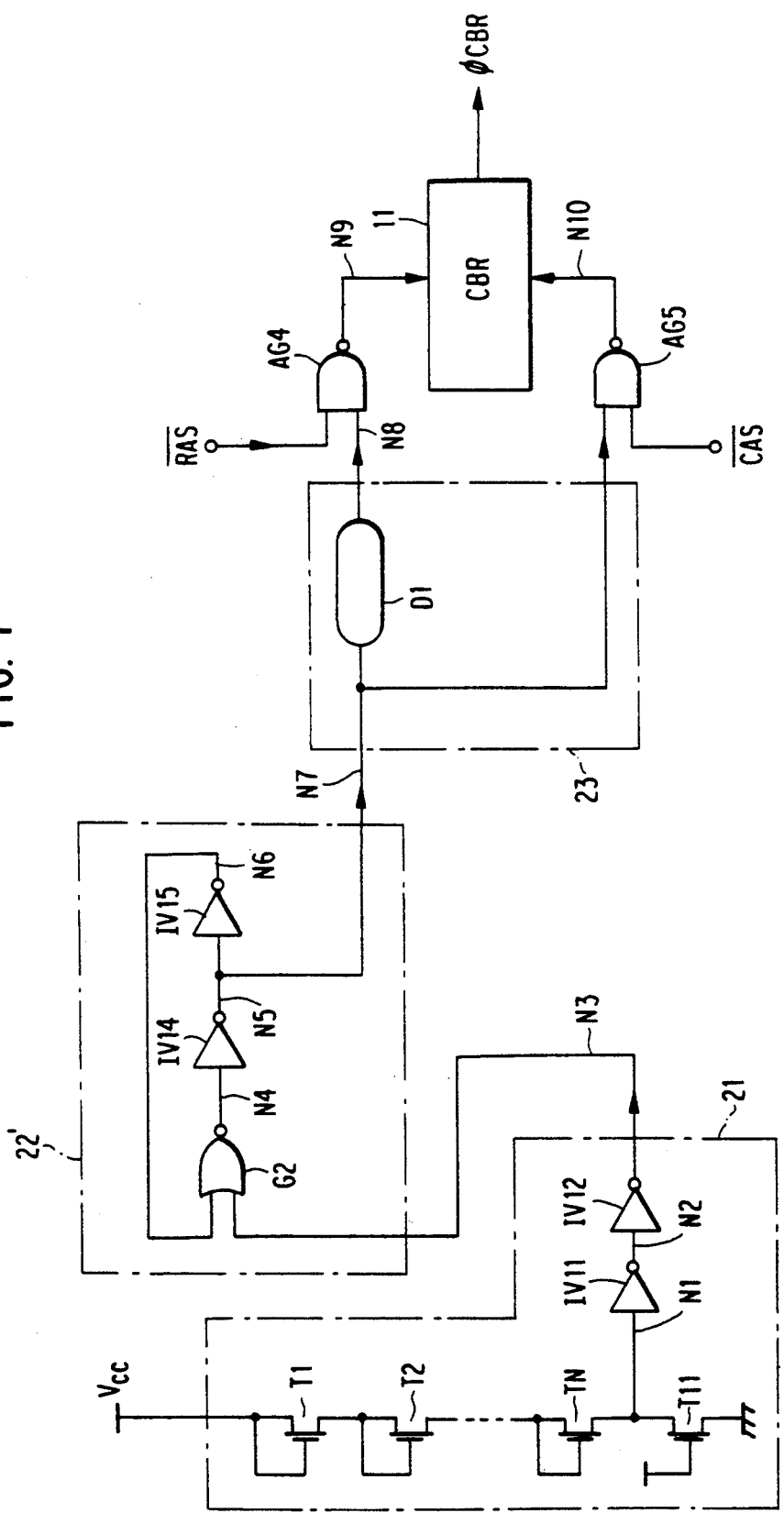
FIG. 7 is a block diagram to show a refresh control circuit of the fourth embodiment according to the present invention.

A refresh control circuit according to the fourth preferred embodiment is shown in FIG. 7. According to this embodiment, the ring oscillation circuit 22' is identical in construction to the third embodiment, while the CBR signal generator 3 comprises a delay element D1 alone, and the NAND gates $AG_4$ and $AG_5$ are employed.

The operations of these third and fourth embodiments are also the same as that in the first embodiment.

As has been described above, the present invention is so structured that when the source voltage drops below the lower limit of the recommended operating voltage, signals identical to the row address strobe signal $\overline{RAS}$ and the column address strobe signal $\overline{CAS}$ in the CBR refresh cycle are generated and supplied to the detection circuit 11 to thereby automatically switch to a refresh mode whenever the voltage drops below the lower limit of the recommended operating voltage. This not only prevents loss of data but minimizes the voltage consumption during the refresh operations as the voltage can be maintained at a low level.

What is claimed is:

1. A dynamic memory comprising a memory array having a plurality of dynamic memory cells arranged in rows and columns, an address input means to receive a row address information, a refresh address counter to generate an internal refresh address, a switching circuit connected to said address input means and said refresh address counter to take out a row address information when in a first state and an internal refresh address when in a second state, a refresh circuit to refresh memory cells in one of said rows in said memory array in response to either said row address information or said internal refresh address taken out by said switching circuit, a detection circuit configured so as to detect a decrease in a voltage of a power source voltage terminal and so as to output a detection signal when said voltage has decreased, and a control circuit operatively connected to said detection circuit and said switching circuit so as to set said switching circuit in a first state when said detection signal is not outputted and so as to set said switching circuit in a second state when said detection signal is outputted.

2. A dynamic memory comprising a memory array having a plurality of memory cells arranged in rows and columns, a first terminal to receive a row address strobe signal, a second terminal to receive a column address strobe signal, a set of address terminals, an address buffer to take in an external row address information upon activation of said row address strobe signal via said set of address terminals, a column address buffer to take in a column address information upon subsequent activation of said column address strobe signal under activation of said row address strobe signal via said set of address terminals, a refresh address counter to generate a refresh address, a refresh circuit to select one of said rows in said memory array in response to the input information and to refresh the information stored in the memory cells in the row thus selected, a switching circuit connected to said row address buffer and said refresh address counter to supply as an input information to said refresh circuit an external row address information when in a first state and to supply as an input information to said refresh circuit a refresh address when in a second state, a detection circuit having a first and a second input terminals to generate a detection signal when said second input terminal reaches an active level after said first input terminal has reached the active level, a first means to hold said switching circuit in said second state when a detection signal exists and in the first state when a detection signal is absent, a second means to activate said first input terminal upon activation of said column strobe signal, a third means to activate said second input terminal upon activation of said row address strobe signal, a detection circuit to detect a decrease in a voltage at a power source voltage terminal and to output a detection signal, and a control circuit to control the input terminal at an active level in response to the detection output and to subsequently control said second input terminal at an active level.

* * * * *